United States Patent
Lee et al.

(10) Patent No.: US 7,547,564 B2
(45) Date of Patent: Jun. 16, 2009

(54) METHOD OF MANUFACTURING DEVICE HAVING FLEXIBLE SUBSTRATE AND DEVICE HAVING FLEXIBLE SUBSTRATE MANUFACTURED USING THE SAME

(75) Inventors: Young Chul Lee, Daejeon Metropolitan (KR); Jae Seung Lee, Daejeon Metropolitan (KR); Jeoung Kwen Noh, Daejeon Metropolitan (KR)

(73) Assignee: LG Chem. Ltd., Seoul (KR)

( * ) Notice: Subject to any disclaimer, the term of this patent is extended or adjusted under 35 U.S.C. 154(b) by 422 days.

(21) Appl. No.: 11/589,859

(22) Filed: Oct. 31, 2006

(65) Prior Publication Data

US 2007/0105252 A1    May 10, 2007

(30) Foreign Application Priority Data

Nov. 1, 2005    (KR) .................... 10-2005-0103899

(51) Int. Cl.
*H01L 21/00* (2006.01)
*H01L 29/207* (2006.01)

(52) U.S. Cl. .................... 438/26; 438/25; 438/117; 438/126; 257/E21.502

(58) Field of Classification Search .............. 438/25, 438/26, 99, 117, 126; 257/99, 100, 40, 701, 257/702
See application file for complete search history.

(56) References Cited

U.S. PATENT DOCUMENTS

| | | | |
|---|---|---|---|
| 4,964,945 A | 10/1990 | Calhoun | |
| 5,200,362 A * | 4/1993 | Lin et al. | 29/841 |
| 5,374,469 A | 12/1994 | Hino et al. | |
| 5,827,741 A * | 10/1998 | Beattie et al. | 435/374 |
| 6,025,251 A * | 2/2000 | Jakowetz et al. | 438/464 |
| 6,687,969 B1 | 2/2004 | Dando | |
| 6,790,695 B2 * | 9/2004 | Ogihara et al. | 438/33 |
| 6,888,172 B2 | 5/2005 | Ghosh | |
| 7,176,069 B2 * | 2/2007 | Yamazaki et al. | 438/149 |
| 7,435,606 B2 * | 10/2008 | Lee et al. | 438/26 |
| 7,445,959 B2 * | 11/2008 | Theuss | 438/108 |
| 2003/0199127 A1 | 10/2003 | Liao et al. | |

* cited by examiner

*Primary Examiner*—David A Zarneke
(74) *Attorney, Agent, or Firm*—McKenna Long & Aldridge LLP

(57) ABSTRACT

The present invention relates to a method of manufacturing a device having a flexible substrate and a device having a flexible substrate manufactured using the method.

According to the method of manufacturing a device having a flexible substrate of the invention, glass is used as a mother substrate, a polymer layer, which is used as a substrate, is formed on the mother substrate using a chemical vapor deposition method or a vacuum evaporation method, a device is formed, and finally, the substrate where the device is formed is separated from the mother substrate, such that a large-scale device having a flexible substrate can be manufactured. Further, as a substrate forming an organic light emitting device and a sealant are formed of the same material, the device is not bent due to stress generated from the device itself after the device is manufactured.

10 Claims, 6 Drawing Sheets

【Figure 1】
Parylene N
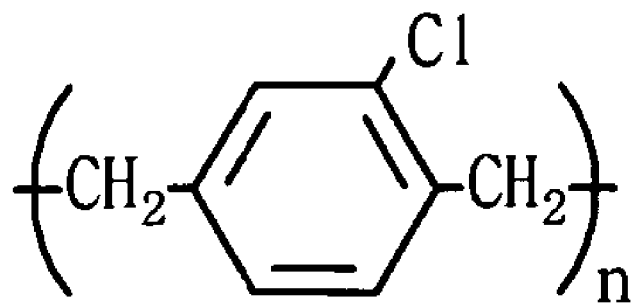
Parylene C
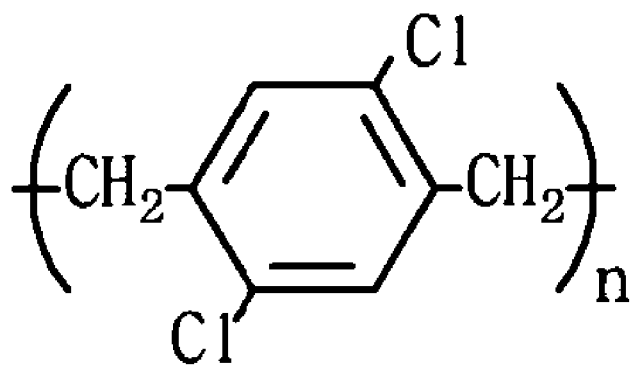
Parylene D

[Figure 2]
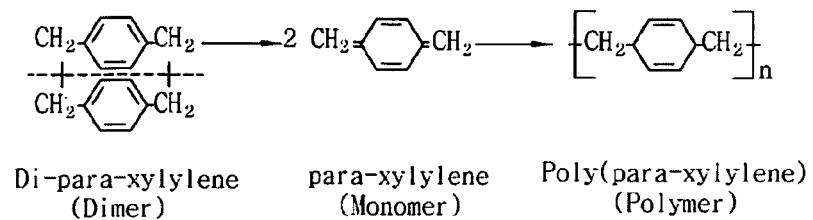
Di-para-xylylene　　　para-xylylene　　　Poly(para-xylylene)
(Dimer)　　　　　　　(Monomer)　　　　　(Polymer)
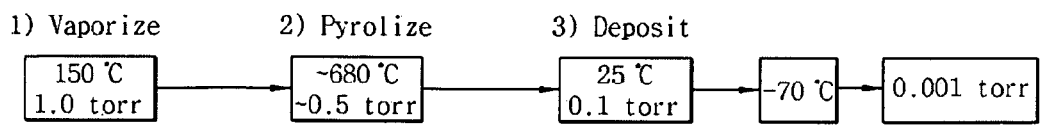
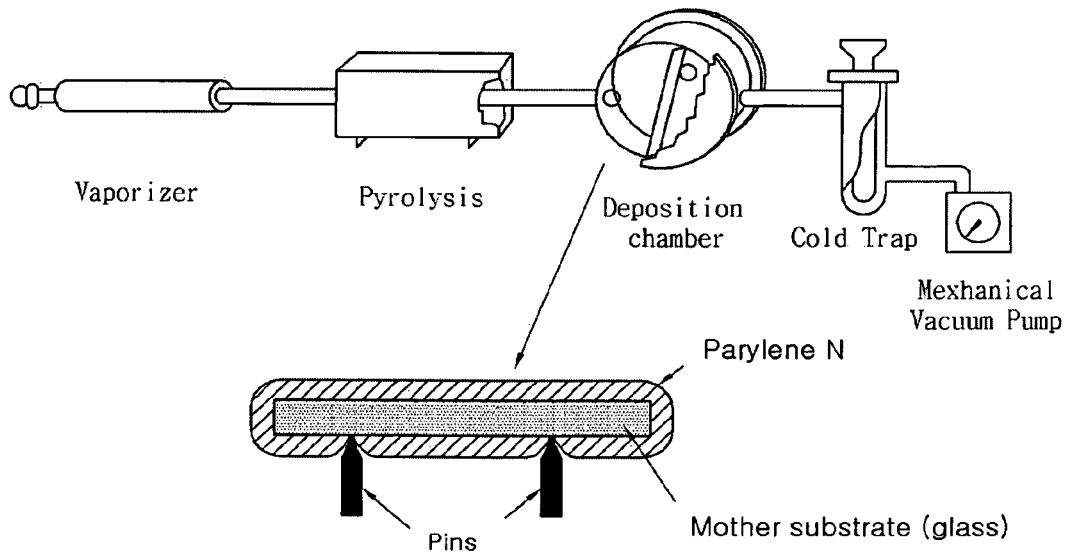

[Figure 3]
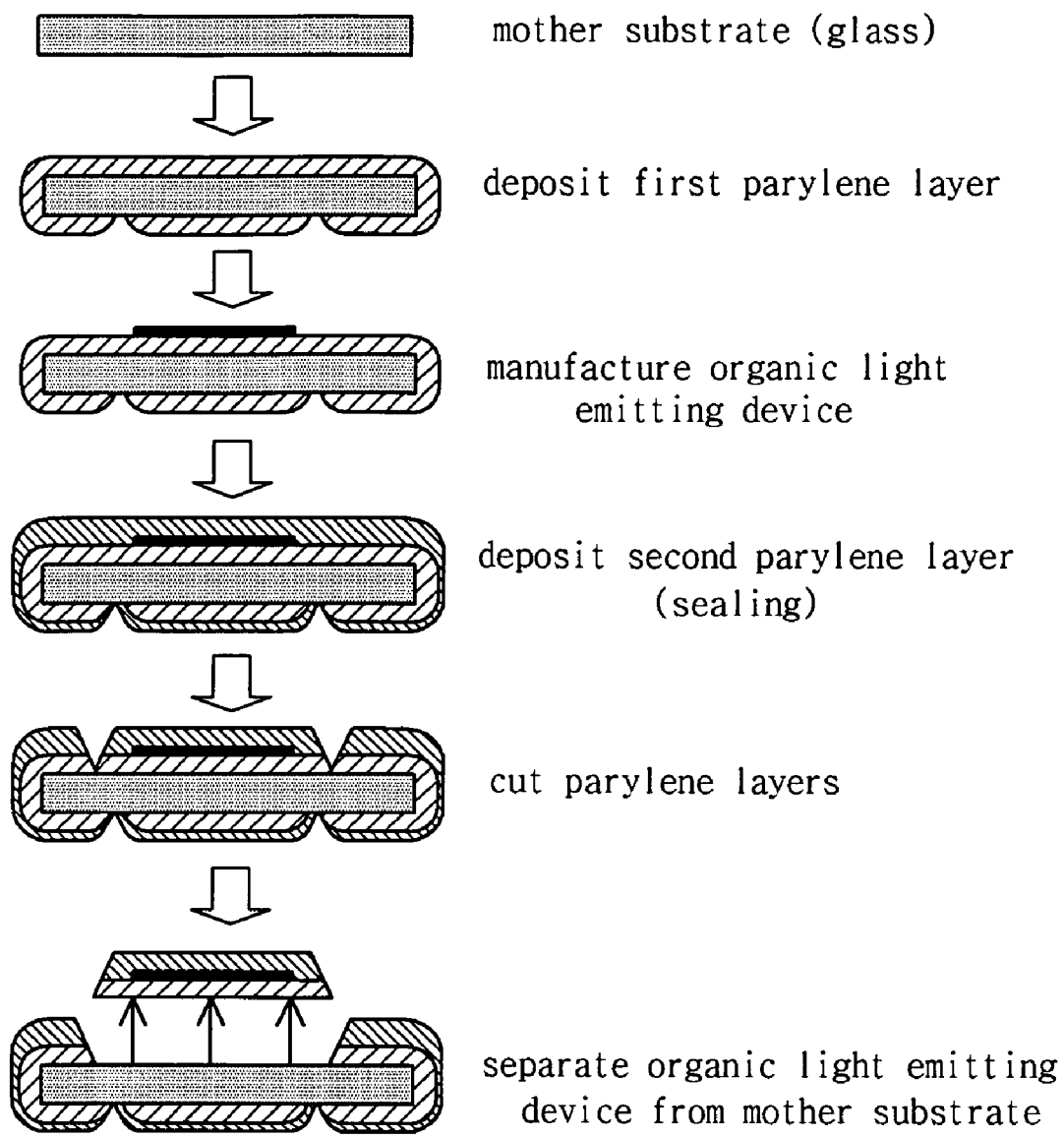

【Figure 4】
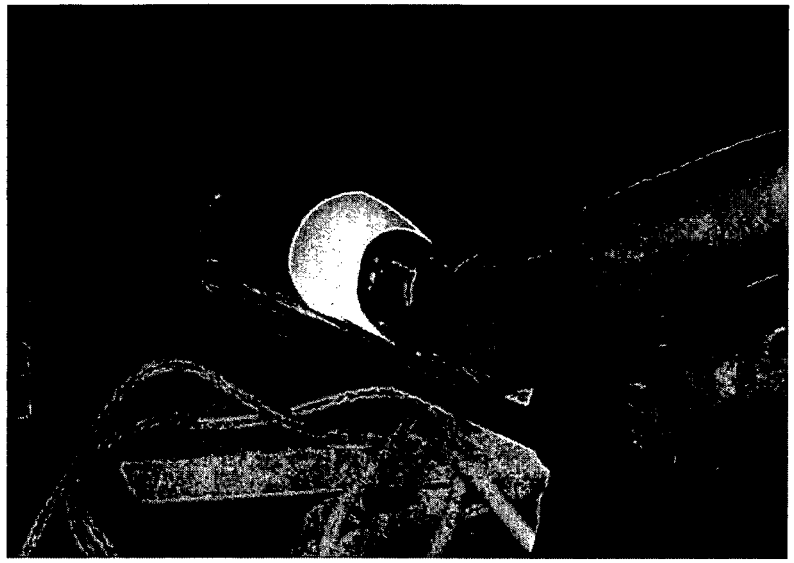
AT THE TIME OF EMITTING LIGHT
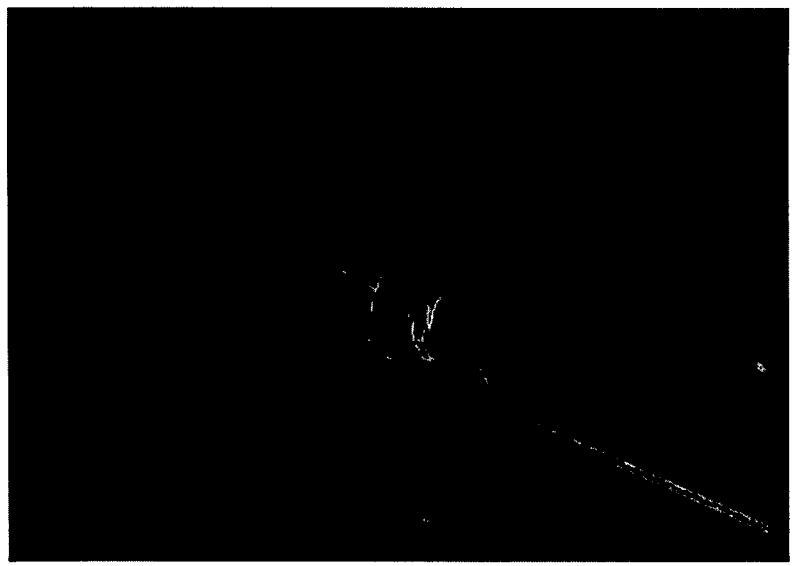
AT THE TIME OF NOT EMITTING LIGHT

[Figure 5]
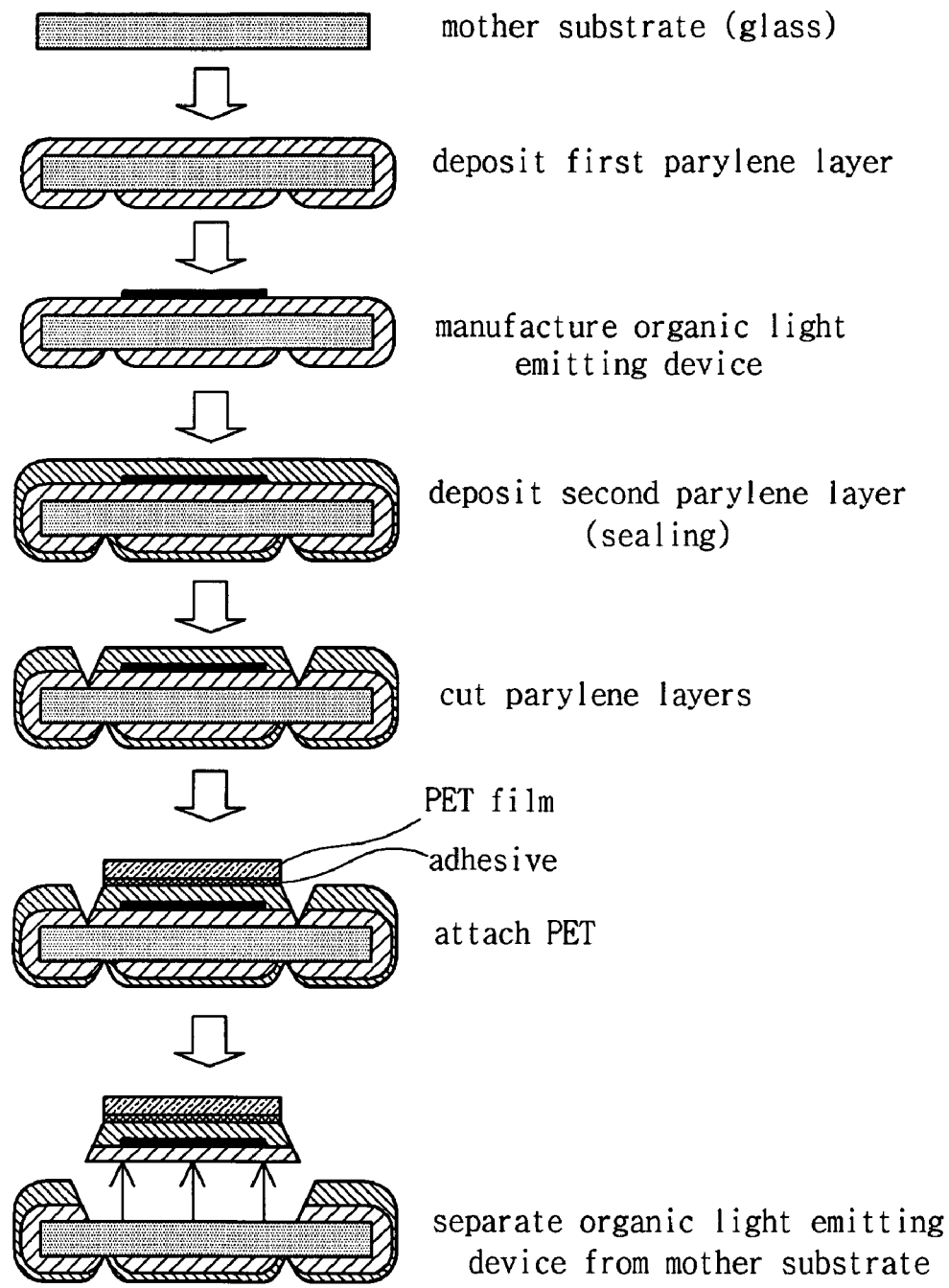

[Figure 6]
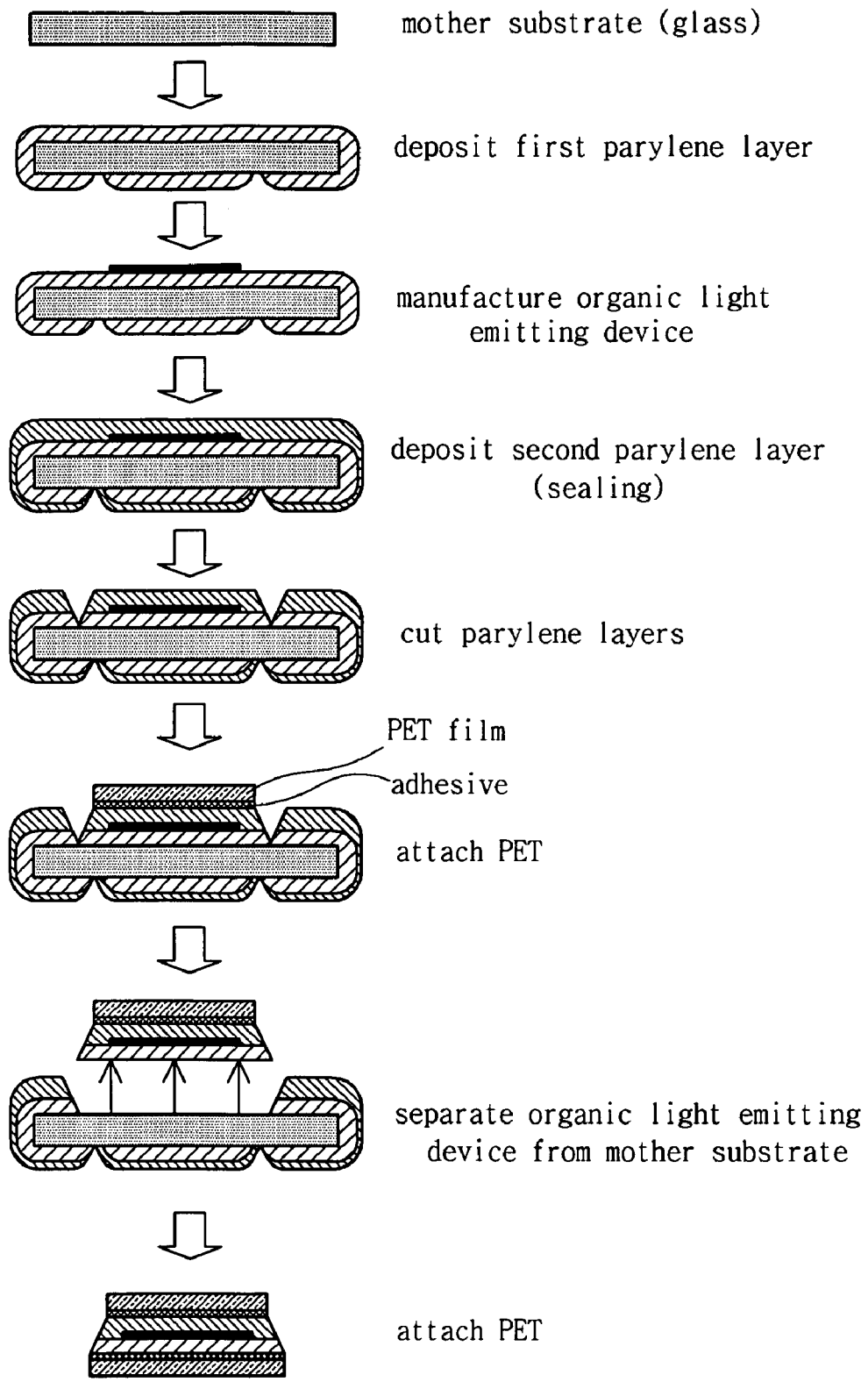

METHOD OF MANUFACTURING DEVICE HAVING FLEXIBLE SUBSTRATE AND DEVICE HAVING FLEXIBLE SUBSTRATE MANUFACTURED USING THE SAME

TECHNICAL FIELD

The present invention relates to a method of manufacturing a device having a flexible substrate and a device having a flexible substrate manufactured using the same.

This application claims priority benefits from Korean Patent Application No. 10-2005-0103899, filed on Nov. 1, 2005, the entire contents of which are fully incorporated herein by reference.

BACKGROUND ART

In general, an organic light emitting device (OLED) includes two electrodes (an anode and a cathode) and at least one organic layer interposed between the two electrodes. In the organic light emitting device having this structure, when a voltage is applied between the two electrodes, holes from the anode and electrons from the cathode are injected into the organic layer. The electrons and the holes are recombined in the organic layer to thereby form excitons. When the excitons drop to a ground state again, photons corresponding to the energy difference are emitted. According to this principle, the organic light emitting device emits visible rays. Using this, it is possible to manufacture information display devices or illumination devices.

The organic light emitting device is widely applied to a small display that has a size of 5 inches or less, for example, an outside window on a cellular phone. An attempt to apply the organic light emitting device to a large display has been made. However, a liquid crystal display (LCD) is widely used in this field of application. In terms of price and performance, the organic light emitting device is not more excellent than the LCD. Therefore, it is difficult for the organic light emitting device to enter markets. Researchers have done large amounts of research on organic light emitting devices that differentiate from the LCD, one of which is a flexible organic light emitting device. The organic light emitting device is a self-emitting type and has a thickness of 0.2 µm or less in general. Therefore, a thin flexible display device can be manufactured with appropriate selection of the material and thickness of a substrate.

Flexible organic light emitting devices according to the related art are manufactured using three main methods.

First, an organic light emitting device is directly manufactured on a substrate that can be bent, such as plastic. Here, there is a disadvantage when it is difficult to use a large-area substrate because the substrate may be bent during the process.

Second, in order to complement the first method, glass that is conventionally used to manufacture the organic light emitting device is used as a mother substrate. A substrate that can be bent, such as thin plastic, is bonded to the mother substrate, and an organic light emitting device is manufactured thereon. Then, the plastic substrate is separated from the glass substrate. In this case, it is possible to use a large-scale substrate due to the rigid characteristic of the glass substrate.

However, since the above-described methods manufacture the plastic substrates through injection or a laminating process, the surface of the plastic substrates is rough. In addition, defects, such as dust formed when the plastic substrate is bonded to the mother substrate, have a fatal effect on life span of the organic light emitting device that is subsequently manufactured using vacuum evaporation.

The third method is a roll-to-roll process, which is the same as the first method in that a substrate, which can be bent, such as plastic or the like, is used. However, this method is different from the first method in that the process is performed while rolling a long substrate. The advantage of this method is that mass production is allowed. However, this method does not reach a technical level sufficient to be applied to manufacture organic light emitting devices.

Because of the above-described reasons, even though research on the flexible organic light emitting devices has actively been made, significant results of commercialization thereof have not been reported.

DISCLOSURE

Technical Problem

When the present inventors make researches on a method of manufacturing a flexible light emitting device having a new structure that can resolve the above-described problems, it has been found that a large-scale device having a flexible substrate can be manufactured by the fact that glass is used as a mother substrate, a polymer layer, which is used as a substrate, is formed on the mother substrate using a chemical vapor deposition or a vacuum evaporation method, a device is formed thereon, and finally, the substrate having the device thereon is separated from the mother substrate. As a result, the inventors have finalized the present invention.

Accordingly, an object of the present invention is to provide a method of manufacturing a device having a flexible substrate.

Another object of the present invention is to provide a device having a flexible substrate that is manufactured according to the above-described method.

Technical Solution

According to an embodiment of the present invention, a method of manufacturing a device having a flexible substrate includes the steps of 1) forming a first polymer layer on a mother substrate using a chemical vapor deposition method or a vacuum evaporation method, 2) forming a device, which is selected from a group consisting of an optical device, an electronic device, and a combination of the optical device and the electronic device, on the first polymer layer, 3) forming a second polymer layer on the device using the chemical vapor deposition method or the vacuum evaporation method, and 4) cutting the first polymer layer and the second polymer layer along an outer edge of the device and separating the device having a structure, in which the first polymer layer, the device, and the second polymer layer are sequentially laminated, from the mother substrate.

Hereinafter, a detailed description will be given of the present invention.

In step 1) of a method of manufacturing a device having a flexible substrate according to an embodiment of the invention, a mother substrate is initially cleaned using acetone and methanol. Then, the mother substrate is put into a vacuum chamber, and a first polymer layer is formed by a chemical vapor deposition method or a vacuum evaporation method.

The mother substrate includes any one kind selected from a group consisting of a glass substrate, a metal plate, or ceramic. Particularly, it is preferable that the glass substrate be used.

All kinds of materials that can be manufactured by the vacuum evaporation method can be used for a polymer of the first polymer layer. However, the materials need to be easily separated from the mother substrate after a device is manufactured. Preferably, the polymer includes parylene N, C, D, or the like. In particular, the parylene C has an advantage in terms of deposition speed. FIG. 1 shows molecular formulas of parylene N, C and D. The parylene is known to be transparent in a visible region, and more excellent in blocking humidity and oxygen than any other polymer materials.

The first polymer layer is deposited over the entire surface of the glass substrate, except for point contacts of three pins for supporting the glass substrate that is the mother substrate. Because the first polymer layer is very weakly bonded to the glass substrate, when the first polymer layer does not cover the entire surface of the glass substrate but is only deposited on the surface where a device will be manufactured, the first polymer layer may be separated from the glass substrate during the process of manufacturing the device. Therefore, the first polymer layer needs to be deposited over the entire surface of the glass substrate. The first polymer layer can be easily separated from the glass substrate after manufacturing the device because the first polymer layer is weakly bonded to the glass substrate. Meanwhile, when a predetermined surface treatment is performed on the glass substrate so as to improve adhesion between the first polymer layer and the glass substrate, the first polymer layer does not need to be deposited over the entire surface of the glass substrate. In this case, however, a problem may occur when the glass substrate and the first polymer layer are separated from each other after the device is manufactured. Therefore, it is preferable that the first polymer layer be deposited over the entire surface of the glass substrate. Here, the first polymer layer has a thickness of 5 to 1,000 μm, and preferably, of 10 to 100 μm.

As described above, since the substrate that can be bent and is used to manufacture an organic light emitting device is formed on the mother substrate using the vacuum evaporation method, generation of dust, which is formed on the plastic substrate because of processes, such as injection, extrusion, and the like, is prevented. The roughness of the surface is also good enough to manufacture the organic light emitting device.

In step 2), a device that is selected from a group consisting of an optical device, an electronic device, and a combination thereof is formed on the first polymer layer.

The device may be an organic light emitting device that has a positive electrode, an organic material having a multi-layered structure, and a negative electrode, which are formed on the first polymer layer.

In addition to the organic light emitting device, the device may be any one kind selected from a group consisting of an organic/inorganic thin film transistor, a silicon thin film transistor, and liquid crystal.

In step 3), the device manufactured in the step 2) and having a structure, in which the first polymer layer and the device are sequentially laminated on the mother substrate, is put into a vacuum chamber. A second polymer layer is formed according to the chemical vapor deposition method or the vacuum evaporation method. This step is a sealing process to protect the device against external air. At this time, the second polymer layer has a thickness of 5 to 1000 μm, and preferably, of 10 to 100 μm.

Preferably, a polymer used for the second polymer layer is the same as the polymer used for the first polymer layer because there is no stress due to difference in thermal expansion coefficient of the polymers. However, a polymer other than the polymer of the first polymer layer may be used. Further, when the first polymer layer and the second polymer layer are formed of the same material, it is possible to prevent stress that is self-generated if the thickness difference between the first polymer layer and the second polymer layer is 20% or less.

In step 4), the first polymer layer and the second polymer layer are cut along an outer edge of the device by a knife or the like, such that the device having the structure, in which the first polymer layer, the device, and the second polymer layer are sequentially laminated, is separated from the mother substrate. In order to smoothly separate the first polymer layer from the mother substrate, it is preferable that the mother substrate and the first polymer layer be physically attached to each other weakly, for example, an attachment not chemically coupled with each other or are not strongly attached to each other between the mother substrate and the first polymer layer which can be rendered by a vapor deposition method. In particular, when the first polymer layer is formed of parylene, since adhesion between the parylene and the glass forming the mother substrate is very weak, the mother substrate and the first polymer layer can be easily separated from each other.

According to the method of manufacturing the device according to the embodiment of the invention, the first polymer layer is formed on the mother substrate using the vacuum evaporation method to thereby form the substrate that can be bent, the optical device or the electronic device is manufactured thereon, the second polymer layer is deposited on the manufactured device using the vacuum evaporation method, and the mother substrate is separated therefrom, such that it is possible to manufacture various kinds of devices that can be bent.

FIG. 3 shows a process of manufacturing an organic light emitting device having a flexible substrate according to an embodiment of the present invention.

Meanwhile, in the step 4), after the first polymer layer and the second polymer layer are cut along an outer edge of the device, a step of applying an adhesive to the second polymer layer inside the cut region and attaching a flexible polymer film or a metal film may be further included before the device is separated from the mother substrate.

Further, a step of applying an adhesive to the opposite side of the device, where the first polymer layer is laminated, and attaching a flexible polymer film or a metal film may be included after the device is separated from the mother substrate.

Any film can be used as the flexible polymer film as long as the film transmits light. Preferably, a PET film is used. In a case of the metal film, the metal film needs to be only attached to the opposite side where light is emitted.

Hereinafter, preferred embodiments of the present invention will be disclosed for the understanding of the invention. However, the following embodiments are provided only for the better understanding of the invention, and the present invention is not limited thereto.

Advantageous Effects

According to a method of manufacturing a device having a flexible substrate of the invention, glass is used as a mother substrate, a polymer layer, which is used as a substrate, is formed on the mother substrate by using a chemical vapor deposition method or a vacuum evaporation method, a device is formed, and finally, the substrate where the device is formed is separated from the mother substrate, such that a large-scale device having a flexible substrate can be manufactured. Further, as a substrate forming an organic light emitting device and a sealant are formed of the same material, the device is not bent due to stress generated from the device itself after the device is manufactured.

DESCRIPTION OF DRAWINGS

FIG. 1 is a view showing molecular formulas of parylene N, C and D;

FIG. 2 is a conceptual view showing a parylene deposition process;

FIG. 3 is a view showing a process of manufacturing an organic light emitting device having a flexible substrate according to an embodiment of the present invention;

FIG. 4 is a view showing pictures when the organic light emitting device having the flexible substrate according to the embodiment of the present invention emits light and does not emit light;

FIG. 5 is a view showing a process of manufacturing an organic light emitting device having a flexible substrate according to an embodiment of the present invention to which PET is attached to one side thereof; and FIG. 6 is a view showing a process of manufacturing an organic light emitting device having a flexible substrate according to an embodiment of the present invention to which PET is attached to both sides thereof.

MODE FOR INVENTION

First Embodiment

Manufacturing organic light emitting device having flexible substrate according to first embodiment of the present invention A glass substrate is used for a mother substrate, and parylene C is used for a substrate for manufacturing an organic light emitting device and a sealant.

The glass substrate, which is the mother substrate and has a size of 100×100 mm$^2$, is initially cleaned using acetone and methanol. Then, the cleaned glass substrate is put into a parylene deposition apparatus. A first parylene layer is deposited to a thickness of 30 μm using a vapor deposition method in the parylene deposition apparatus. The parylene is deposited over the entire surface of the glass substrate, except for point contacts of three pins for supporting the glass substrate, which is the mother substrate. FIG. 2 is a conceptual view showing a parylene deposition process. After the first parylene layer is deposited over the mother substrate, an organic light emitting device is manufactured thereon by forming a positive electrode, an organic material having a multi-layered structure, and a negative electrode. Then, as a sealing process of protecting the organic light emitting device against external air, the manufactured device having a structure, in which the first parylene layer and the organic light emitting device are sequentially deposited on the mother substrate, is put into the parylene deposition apparatus. Further, a second parylene layer is deposited to a thickness of 30 μm using the vapor deposition method. In order to separate the organic light emitting device from the mother substrate, the two parylene layers are cut along an outer edge of the organic light emitting device, by using a knife or the like. Then, the device having a structure that includes the first parylene layer, the organic light emitting layer, and the second parylene layer is separated from the mother substrate, such that the device is manufactured.

The manufactured organic light emitting device has a total thickness of about 60 μm. Further, the organic light emitting device can be easily bent and operates normally.

FIG. 3 shows a process of manufacturing an organic light emitting device having a flexible substrate according to a first embodiment of the invention.

FIG. 4 shows pictures when the manufactured organic light emitting device having the flexible substrate emits light and does not emit light.

As shown in FIG. 4, the organic light emitting device having the flexible substrate according to the first embodiment of the invention emits light even when the organic light emitting device is bent within the radius of curvature of 1 cm.

Second Embodiment

Manufacturing device having flexible substrate according to second embodiment of the invention.

According to the first embodiment, the first and second parylene layers have a thickness of 30 μm, respectively. The device having a total thickness of 60 μm can be very easily bent, and is rather susceptible to damage. As a method of complementing this disadvantage and reducing deposition time of thick parylene layers, a flexible polymer film or a metal film may be additionally attached to one side or both sides of the device.

A method of manufacturing a device according to this embodiment is the same as the method according to the first embodiment until a first parylene layer, an organic light emitting device, a second parylene layer are formed on a mother substrate, and then the two parylene layers are cut. Here, the first parylene layer and the second parylene layer have a thickness of 10 μm, respectively. The parylene layers do not need to be thick because an additional film will be attached.

After the first parylene layer and the second parylene layer are cut from the device manufactured according to the first embodiment, an adhesive is applied to the second parylene layer inside the cut region and a PET film is attached. Then, the first parylene layer is separated from the mother substrate to thereby manufacture the device.

In addition, the adhesive may be applied to the opposite side of the device, where the first parylene layer is attached, and then the PET film may be attached.

The PET film has a thickness of about 100 μm, and physical strength of the manufactured organic light emitting device is great.

FIG. 5 shows a process of manufacturing an organic light emitting device having a flexible substrate to which PET is attached to one side thereof. FIG. 6 shows a process of manufacturing an organic light emitting device having a flexible substrate to which PET is attached to both sides thereof. The PET film can be replaced with any other films as long as the film transmits light. The PET film can also be replaced with the metal film, but the metal film needs to be only attached to the opposite side where light is emitted.

Third and Forth Embodiment

Organic lighting emitting device having a flexible substrate is prepared by same process in the first and second embodiment except parylene N is used instead of parylene C as sealant material. Same results were obtained in the first and second embodiment.

The invention claimed is:

1. A method of manufacturing a device having a flexible substrate, comprising the steps of:
   1) forming a first polymer layer on a mother substrate using a chemical vapor deposition method or a vacuum evaporation method;

2) forming a device, which is selected from a group consisting of an optical device, an electronic device, and a combination of the optical device and the electronic device, on the first polymer layer;
3) forming a second polymer layer on the device using the chemical vapor deposition method or the vacuum evaporation method; and
4) cutting the first polymer layer and the second polymer layer along an outer edge of the device and separating the device having a structure, in which the first polymer layer, the device, and the second polymer layer are sequentially laminated, from the mother substrate.

2. The method as set forth in claim 1, wherein, in the step 1), the mother substrate includes one selected from a group consisting of a glass substrate, a metal plate, and ceramic.

3. The method as set forth in claim 1, wherein, in the step 1), the first polymer layer is deposited over the entire surface of the mother substrate.

4. The method as set forth in claim 1, wherein the device formed in the step 2) is selected from a group consisting of an organic light emitting device, an organic/inorganic thin film transistor, a silicon thin film transistor, and liquid crystal.

5. The method as set forth in claim 1, wherein a polymer of the first polymer layer and a polymer of the second polymer layer are the same, and are selected among parylene N, C, and D.

6. The method as set forth in claim 1, wherein the first polymer layer and the second polymer layer have a thickness of 5 to 1,000 μm.

7. The method as set forth in claim 1, further comprising:
after the cutting of the first polymer layer and the second polymer layer along the outer edge of the device in the step 4), applying an adhesive to the second polymer layer inside the cut region and attaching a flexible polymer film or a metal film, before the separating of the device having the structure, in which the first polymer layer, the device, and the second polymer layer are sequentially laminated, from the mother substrate.

8. The method as set forth in claim 7, further comprising:
applying an adhesive to the opposite side of the device, where the first polymer layer is laminated, and attaching a flexible polymer film or a metal film after the device is separated from the mother substrate.

9. A device manufactured by the method as set forth in claim 1.

10. The device as set forth in claim 9, wherein the device is selected from a group consisting of an organic light emitting device, an organic/inorganic thin film transistor, a silicon thin film transistor, and liquid crystal.

* * * * *